US010106397B1

(12) United States Patent
Kim et al.

(10) Patent No.: US 10,106,397 B1
(45) Date of Patent: Oct. 23, 2018

(54) ACOUSTIC TWEEZERS

(71) Applicant: University of Southern California, Los Angeles, CA (US)

(72) Inventors: Eun Sok Kim, Rancho Palos Verdes, CA (US); Youngki Choe, Los Angeles, CA (US); Jonathan W. Kim, Rancho Palos Verdes, CA (US); K. Kirk Shung, Monterey Park, CA (US)

(73) Assignee: University of Southern California, Los Angeles, CA (US)

( * ) Notice: Subject to any disclaimer, the term of this patent is extended or adjusted under 35 U.S.C. 154(b) by 1493 days.

(21) Appl. No.: 13/868,965

(22) Filed: Apr. 23, 2013

Related U.S. Application Data

(60) Provisional application No. 61/637,209, filed on Apr. 23, 2012.

(51) Int. Cl.

| | |
|---|---|
| ***B81B 3/00*** | (2006.01) |
| ***G01N 1/40*** | (2006.01) |
| ***G01N 29/22*** | (2006.01) |

(52) U.S. Cl.
CPC .......... *B81B 3/0021* (2013.01); *B81B 3/0027* (2013.01); *G01N 1/4077* (2013.01); *G01N 29/221* (2013.01)

(58) Field of Classification Search
CPC ..... A61B 8/00; A61B 5/0097; G01S 15/8965; G01N 29/0681; G01N 29/075; G01N 29/11; G01N 29/221; G01N 29/2418; G01N 2291/02827; G01N 2291/02854; G01N 2291/0423; G01N 2291/0427
See application file for complete search history.

(56) References Cited

U.S. PATENT DOCUMENTS 3,815,409 A * 6/1974 Macovski ............ G01N 29/221 367/101
5,094,108 A * 3/1992 Kim ..................... G01N 29/041 310/335
7,719,170 B1 * 5/2010 Kim ........................ H01L 41/29 310/335
2006/0272418 A1 * 12/2006 Maris .................. A61B 5/0097 73/606

OTHER PUBLICATIONS

Hadimioglu et al., IEEE 1993 Ultrasonics Symposium, pp. 579-582, 4 pages.*
Yu et al., J. Microelectromechanical Systems, 16(2) (2007) 445-453, 9 pages.*
Wu, "J. Acoustical Soc. of America" 89 (1991) 2140-2143, 5 pages. (Year: 1991).*
Lee et al., "Applied Physics Letters" 95 (2009) 073701, 4 pages. (Year: 2009).*
Lee et al. 2005, "J. Acoustical Soc. of America" 117 (2005) 3273, 9 pages. (Year: 2005).*

(Continued)

*Primary Examiner* — Bobby Ramdhanie
*Assistant Examiner* — Denise R Anderson
(74) *Attorney, Agent, or Firm* — Fish & Richardson P.C.

(57) ABSTRACT

In some aspects of the disclosure, an apparatus includes an XYZ control stage and an acoustic transducer coupled with the XYZ control stage. The acoustic transducer includes a multi-foci Fresnel lens having multiple focal spots.

16 Claims, 13 Drawing Sheets

(56) References Cited

OTHER PUBLICATIONS

Ashkin et al., "Observation of a single-beam gradient force optical trap for dielectric particles", Optics Letters, vol. 11, No. 5, May 1986, pp. 288-290.
Choe, Youngki et al., "Microparticle trapping in an ultrasonic Bessel beam", published online Dec. 8, 2011, Applied Physics Letters 99, 233704 (2011), 4 pages.
Choe, Youngki et al., "Ultrasonic Microparticle Trapping by Multi-Foci Fresnel Lens", May 2-5, 2011, Frequency Control and the European Frequency and Time Forum (FCS), 2011 Joint Conference of the IEEE International, 4 pages.
Durnin, J., "Exact solutions for nondiffracting beams. I. The scalar theory", vol. 4, No. 4, Apr. 1987, J. Opt. Soc. Am. A, pp. 651-654.
Grier, David G., "A revolution in optical manipulation", Nature, vol. 424, Aug. 14, 2003, pp. 810-816.
Lee, Chuang-Yuan et al., "Acoustic Ejector with Novel Lens Employing Air-Reflectors", MEMS 2006, Jan. 2006, pp. 170-173.
Lee, Jungwoo et al., "Single beam acoustic trapping", Applied Physics Letters, 95, 073701 (2009), 4 pages.
Marston, Philip L., "Axial radiation force of a Bessel beam on a sphere and direction reversal of the force", J. Acous. Soc. Am. 120 (6), Dec. 2006, pp. 3518-3524.
Milne, Graham et al., "Tunable generation of Bessel beams with a fluidic axicon", Applied Physics Letters 92, 261101 (2008), 3 pages.
Nilsson, J. et al., "Review of cell and particle trapping in microfluidic systems", Analytica Chimica Acta 649 (2009), pp. 141-157.
Riera, Enrique et al., "Airborne ultrasound for the precipitation of smokes and powders and the destruction of foams," *Ultrasonics sonochemistry*, vol. 13, Issue 2, Feb. 2006, pp. 107-116.
Whitworth Glenn et al., "Particle col. formation in a stationary ultrasonic field", J. Acoust. Soc. Am. 91 (1), Jan. 1992, pp. 79-85.
Wu, Junru, "Acoustical tweezers", J. Acoust. Soc. Am. 89 (5), May 1991, pp. 2140-2143.

* cited by examiner

ACOUSTIC TWEEZERS

CROSS REFERENCE TO RELATED APPLICATIONS

This application claims priority to U.S. Provisional Application 61/637,209 filed on Apr. 23, 2012, the entire contents of which are incorporated herein by reference.

STATEMENT OF GOVERNMENT RIGHTS

This invention was made with government support under grant R21HG005118 awarded by the National Institutes of Health (NIH). The United States government has certain rights in the invention.

TECHNICAL FIELD

This disclosure relates to acoustic tweezers and their applications.

BACKGROUND

Several known techniques are used to control and manipulate particles. For example, optical tweezers use a tightly focused laser beam to trap particles. As another example, magnetic trapping arrays use magnetic beads, which are attached to particles for trapping the particles.

SUMMARY

This disclosure describes techniques and systems for trapping (also referred as "capturing") a particle in a liquid such as water. The particle can be a microparticle, a group of microparticles, a solid particle, a living cell, a lipid particle, a polystyrene particle or a latex particle. The disclosed techniques can use an acoustic tweezer (such as a trapping transducer) to trap the particle without any mechanical contact between the trapped particle and the acoustic tweezer. In some implementations, the acoustic tweezer can be a single ultrasonic transducer (also referred as a "transmitter") built on a multi-foci Fresnel lens, which is designed to focus ultrasound waves creating a negative pressure region where the particle is trapped. The acoustic tweezer can capture and retain one or more particles at specific positions in 3-dimensional (3-D) space with respect to the acoustic tweezer. The captured one or more particles can follow the movement of the acoustic tweezer.

In general, in some aspects of the disclosure, an apparatus includes an XYZ control stage and an acoustic transducer coupled with the XYZ control stage. The acoustic transducer includes a multi-foci Fresnel lens having multiple focal spots adjacent to each other.

In some implementations, the multi-foci Fresnel lens can include annular rings, and at least two of the annular rings have different focal lengths. The multi-foci Fresnel lens can consist of seven annular rings, a first two of the seven annular rings having a first focal length, a next two of the seven annular rings having a second focal length, and a remaining three of the seven annular rings having a third focal length, where each of the first, second and third focal lengths are different.

In some implementations, the annular rings can consist of any number of annular rings between two and twelve, and the annular rings can be grouped into any number of sets between two and twelve, where each of the sets has a different focal length. The multi-foci Fresnel lens can include one or more air-reflectors. The multi-foci Fresnel lens can include one or more annular air-reflectors.

In some practices, the multi-foci Fresnel lens can be formed on a PZT (lead zirconate titanate) ultrasonic transducer with top and bottom electrodes sandwiching the PZT. The multi-foci Fresnel lens can include circular electrodes on top and bottom surfaces of a PZT. The multi-foci Fresnel lens can include one or more pie-shaped electrodes on top and bottom surfaces of a PZT.

In some implementations, the multi-foci Fresnel lens can be formed on a silicon, glass or plastic substrate with ZnO film, AlN film, or PZT film. In addition, the multi-foci Fresnel lens can be integrated with microfluidic components built on a silicon, glass or plastic substrate.

In some aspects of the disclosure, a method is disclosed for microparticle trapping in three dimensional space. The method includes using a single ultrasonic transducer to produce a negative pressure region at micron scale. In other aspects, corresponding systems and devices can be provided.

According to other aspects of the disclosure, a method is disclosed that includes creating a diaphragm, and building an acoustic transducer on the diaphragm, wherein the acoustic transducer includes a multi-foci Fresnel lens configured to produce a Bessel beam. The diaphragm can include a diaphragm material, and creating the diaphragm can include depositing the diaphragm material on a substrate, and etching the substrate to form the diaphragm.

According to another aspect of the disclosure, a method includes: creating a diaphragm; and building an acoustic transducer on the diaphragm, wherein the acoustic transducer includes a multi-foci Fresnel lens configured to produce a Bessel beam. The diaphragm can include a diaphragm material, and creating the diaphragm can include: depositing the diaphragm material on a substrate; and etching the substrate to form the diaphragm. The diaphragm material can include a low-stress silicon nitride film, and the substrate can include a silicon wafer. The depositing can include depositing the diaphragm material on one or both sides of the silicon wafer, and the creating the diaphragm can include removing a portion of the diaphragm material from one side of the silicon wafer. The diaphragm material can include a silicon oxide. Alternatively, creating the diaphragm can include etching a silicon substrate until a 1-100 microns thick piece of silicon is formed.

Building the acoustic transducer can include: depositing and patterning an electrode on the diaphragm either before or after forming the diaphragm; depositing a film on the electrode; and depositing and patterning another electrode on the film to form the multi-foci Fresnel lens. Depositing the film on the electrode can include depositing ZnO film, AlN film, or PZT film on the electrode.

The techniques and systems disclosed in this specification provide benefits and advantages, which can include one or more of the following. In general, the disclosed techniques can be used to generate a focused acoustic beam, which can be used to manipulate particles in a versatile and applicable way. For example, the disclosed acoustic tweezers can impart high "negative" energy (or "negative" impact force) for trapping particles and also offer a wide range of spatial control (of the trapped particles) through electrical tuning of the trapping zones. The acoustic tweezers can capture particles (e.g., with diameters ranging from a few microns to several hundred microns), move and place the particles at a precise location for diagnostics, construction, etc. Such capturing of a wide range of diameters is possible due to a relatively large mechanical forces associated with acoustic waves, unlike optical tweezers which cannot trap large particles without heating due to the very small mechanical forces associated with light waves.

In general, the disclosed techniques can be used to trap particles using a single acoustic tweezer, without using two counteracting acoustic tweezers to create a force potential well for trapping, or without confining the trapped particle by a sheet such as a mylar sheet. Particles can be trapped without being damaged because trapping is achieved without high light intensity. In addition, there is no need to attach magnetic beads to particles. Further, an acoustic tweezer employing a multi-foci Fresnel lens with an air-reflector can have a high tolerance to manufacturing imprecision such as of the lens thickness. The disclosed techniques can be used to control and manipulate particles in a wide range of applications relating to the study of cells, molecules, DNA, cancer treatments and construction of labs-on-a-chip. Accordingly, the techniques can be applied in biology, physical chemistry and bio-medical research.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages will be apparent from the following detailed description, and from the claims.

BRIEF DESCRIPTION OF THE DRAWINGS

Like reference numbers and designations in the various drawings indicate like elements.

DETAILED DESCRIPTION

The methods and systems described herein can be implemented in many ways. Some useful implementations are described below. The scope of the present disclosure is not limited to the detailed implementations described in this section.

An acoustic tweezer can be used to trap a particle in a liquid by generating a Bessel beam. The particle can be trapped when placed in the path of the Bessel beam, which applies a negative axial radiation force on the particle. In other words, the Bessel beam creates a negative pressure region, where the particle can be trapped. In some implementations, the acoustic tweezer can include a multi-foci Fresnel lens that can produce multiple focal spots for generating the Bessel beam. The multi-foci Fresnel lens can have a number of annular rings, subsets of which can have different focal lengths. Such an acoustic tweezer can generate a negative pressure region which captures various particles in 3-D space, without the aid of other devices such as another acoustic tweezer or a mylar sheet.

An acoustic tweezer can be used to generate acoustic waves forming a Bessel beam with a micron sized region in a liquid. In such a region, particles can be trapped by the negative radiation force formed by the Bessel beam. The wave equation $\psi_B$ for a scalar-wave Bessel beam is an axisymmetric solution of the free-space wave equation, as shown in Eq. (1) below:

$$\psi_B(x,y,z)=-\psi_0\exp(i\kappa z)J_0(\sqrt{x^2+y^2}) \quad (1)$$

where $\psi_0$ is the wave amplitude, $\kappa$ is the axial wave number, $J_0$ is the zeroth-order Bessel function and $\mu$ is the radial wave number. The Bessel beam can create a negative axial radiation force under certain conditions, which may be related to parameter domain (k,a,$\beta$), in which a is the radius of a trapping particle, $\beta$ is a cone angle and k is the wavenumber. The cone angle $\beta$, which characterizes the Bessel beam, can be expressed as Eq. (2), shown below:

$$\beta=\arccos(\kappa/k)=\arcsin(\mu/k). \quad (2)$$

The square of the wavenumber k (i.e., $k^2$) is equal to $\kappa^2+\mu^2$, and also equal to $(\omega/c_0)^2$, where $\omega$ is the angular frequency and $c_0$ is the phase velocity of acoustic waves in the liquid.

Figure 1:
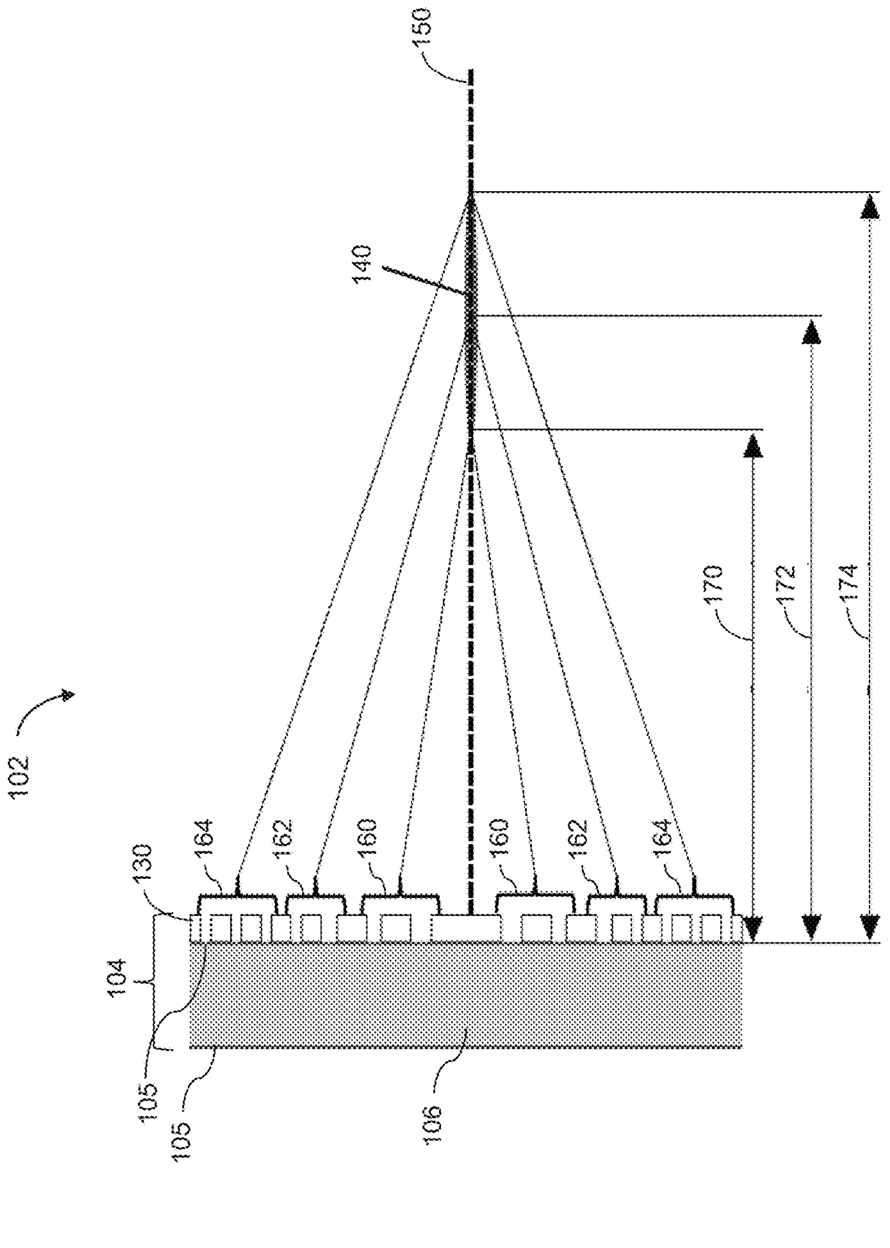
FIG. 1 is a cross-sectional schematic of an example of an acoustic tweezer.

FIG. 1 shows an example of an acoustic tweezer 102 including an acoustic transducer 104. The acoustic transducer 104 can include a PZT 106 (which may be a sheet or film) with electrodes 105 formed on both sides of the PZT 106 and a Fresnel lens 130. Accordingly, the acoustic transducer may be referred as a "acoustic Fresnel transducer." The PZT 106 with electrodes 105 itself may be referred as a "transducer" or an "ultrasonic transducer." In some implementations, the Fresnel lens 130 can be designed to have multiple focal points. In this case, the Fresnel lens 130 may be referred as a "multi-foci Fresnel lens 130." The acoustic tweezer 102 can be an ultrasound tweezer. For example, the acoustic tweezer 102 can operate at any frequency between 10 MHz and 300 MHz, being capable of focusing acoustic waves of 10-300 MHz onto a micron-sized region.

In some implementations, the thickness of PZT 106 can be 127 μm. The multi-foci Fresnel lens 130 can be an air-reflector (also referred as "air-cavity") lens formed on one side of the PZT 106. In the example shown in FIG. 1, the multi-foci Fresnel lens 130 has seven rings. The two inner most rings 160, next two rings 162, and next three rings 164 can have focal lengths 170 (e.g., 830 μm), 172 (e.g., 860 μm), 174 (e.g., 890 μm), respectively. The PZT 106 can generate acoustic waves, which upon passing through the multi-foci Fresnel lens 130, form a Bessel beam 140 along the center line 150 of the multi-foci Fresnel lens

130. In some implementations, the multi-foci Fresnel lens 130 may be considered to include the electrodes 105 and the PZT 106.

Zinc oxide (ZnO) or aluminum nitride (AlN) can be used instead of the PZT 106 to generate the acoustic waves. The ZnO, AlN, or PZT film can be on a silicon substrate.

The acoustic tweezer 102 can trap particles with diameters ranging from 5 to 500 μm. The distance between the acoustic tweezer and the trap position can be from 0.2 to 10 mm. The acoustic tweezer 102 can include a single-focus Fresnel lens used to eject the trapped particles out of the liquid surface.

In some implementations, the multi-foci Fresnel lens 130 can be fabricated on a silicon substrate with ZnO film to produce a negative pressure region of about 10 μm in diameter and using about 300 MHz ultrasonic waves. This allows small particles with diameters down to 5 μm to be trapped.

In some implementations, an acoustic tweezer 102 can eject nanoliter liquid droplets from various liquids (e.g., liquids with a viscosity as large as 55 cSt). The ejection can be in a direction perpendicular to a surface of a liquid and also at various oblique angles with great precision.

Figure 2B:
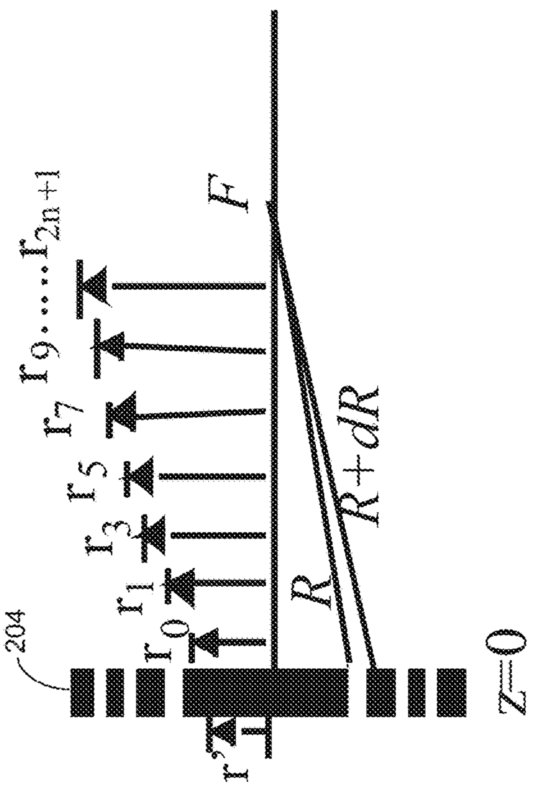
FIGS. 2*a* and 2*b* are top view and side view schematics, respectively, of an example of a multi-foci Fresnel lens.
Figure 2A:
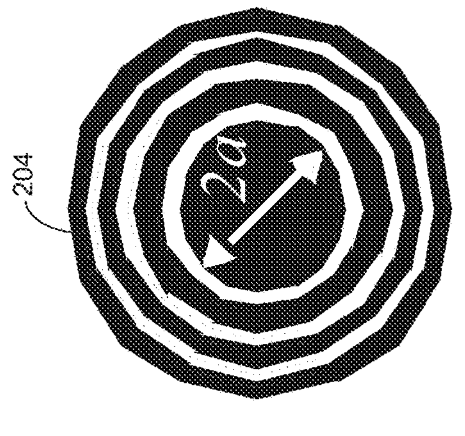

FIGS. 2*a* and 2*b* show an example of a multi-foci Fresnel lens 204. In some implementations, the multi-foci Fresnel lens 204 can be formed by set of electrodes (e.g., annular electrodes) patterned on a PZT film instead of the air-reflector lens described in relation to FIG. 1. FIG. 2*a* shows a schematic top view of the multi-foci Fresnel lens 204. The diameter 2*a* refers to the $1^{st}$ Fresnel band. A set of electrodes can be patterned into Fresnel half wave bands (FHWB) with multiple focal lengths. FIG. 2*b* shows a schematic cross-section view of the multi-foci Fresnel lens 204. The radius of the $k_b$-th Fresnel band ($r_k$) can be based on Eq. (3), shown below:

$$r_k = \sqrt{2k_b\lambda \times \left(F + \frac{k_b\lambda}{2}\right)} \tag{3}$$

where F is the focal length of the $k_b$-th band and A is the wavelength of the generated acoustic wave. z=0 refers to a surface of the multi-foci Fresnel lens 204 and R refers to a distance from the edge of the $1^{st}$ Fresnel band to the corresponding focal point at focal length F. The multi-foci Fresnel lens 204 can include one or more characteristics discussed in relation to the Fresnel lens 130 shown in FIG. 1. It is understood that the Fresnel lens 130 can include one or more characteristics described in relation to FIGS. 2*a* and 2*b*. For example, the Fresnel lens 130 can be designed based on Eq. (3).

Figures 3A, 3B, 3C:
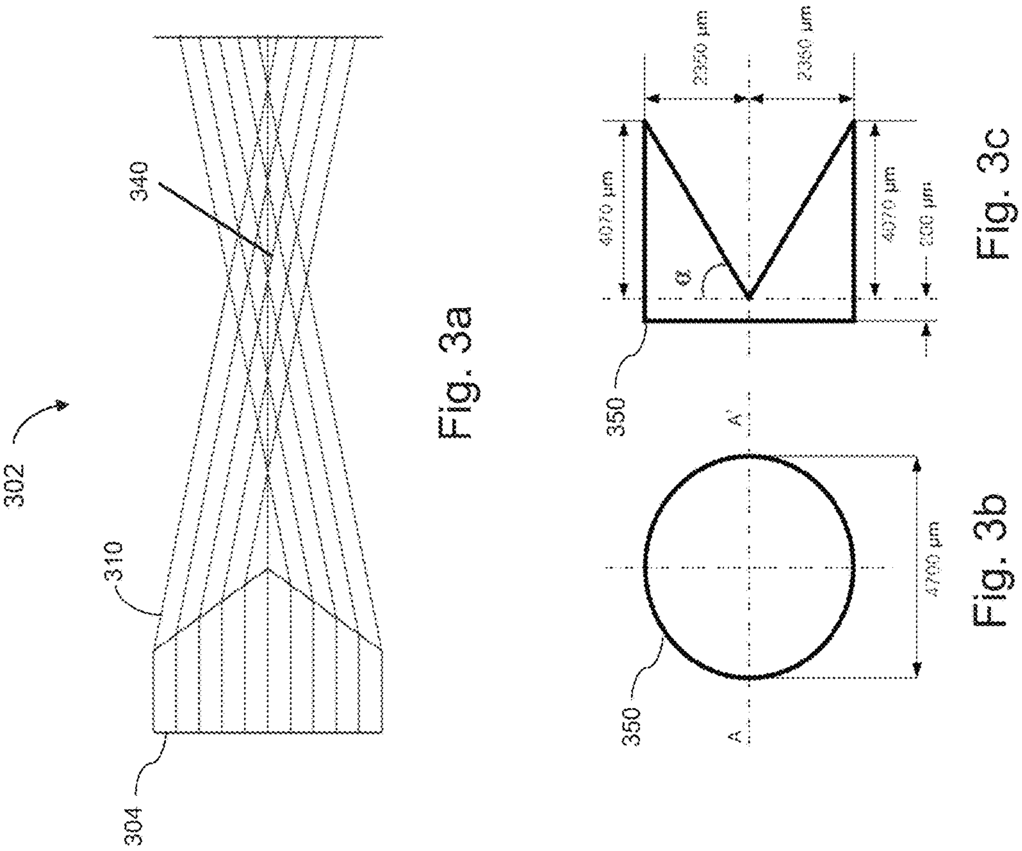
FIGS. 3*a-c* are schematics of examples of axicon lenses.

In some implementations, an acoustic tweezer 302 can include an axicon lens. Referring to FIG. 3*a*, an example of acoustic tweezer 302 includes an axicon lens 304 which produces a Bessel beam 340 by focusing acoustic waves (which are indicated by rays 310) in a region where the focused waves are uniformly distributed. FIG. 3*a* shows a side view of the axicon lens 304. The axicon lens 304 focuses waves closer to the center at a shorter distance than waves further away from the center of the axicon lens 304.

FIG. 3*b* shows a top view of another type of axicon lens 350 with a circular shape having a diameter of 4700 μm. FIG. 3*c* shows a side view of the other type of axicon lens 350, which is different from what is shown in FIG. 3*a*, with a lens angle α=63° to have a cone angle β=60°. Both types of the axicon lens 304 and 350 can be made from aluminum alloy. It is understood that the axicon lens 304 (shown in FIG. 3*a*) can have similar or the same schematic top view as shown in FIG. 3*b*.

Figure 4:
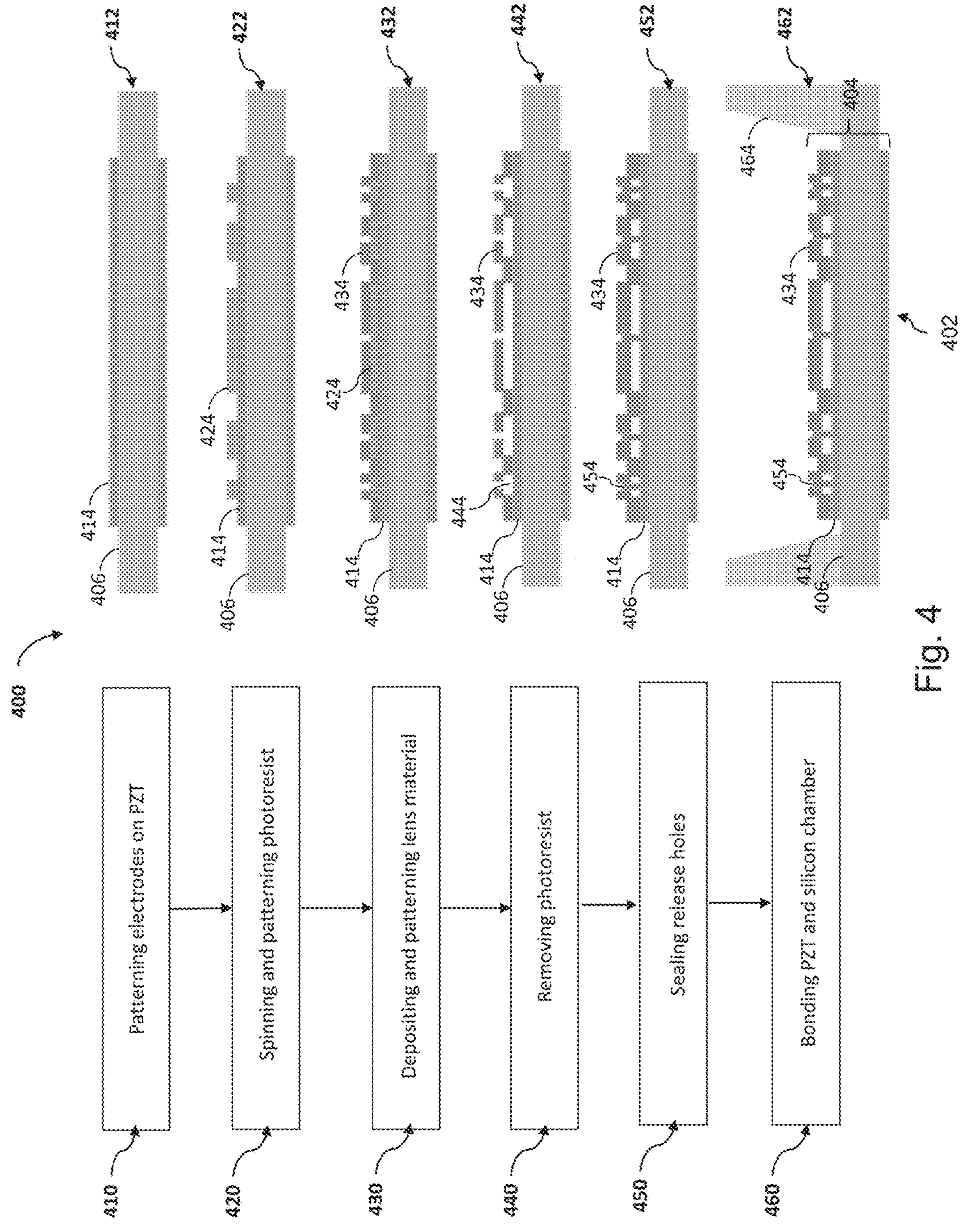
FIG. 4 is a flow chart with schematics depicting an example of a sequence of operations for fabricating an acoustic tweezer.

Referring to FIG. 4, a flow chart 400 depicts exemplary operations for fabricating an acoustic tweezer 402 along with schematic views of corresponding operations. Operations include patterning electrode 414 on a PZT 406 (410). Schematic 412 shows patterned electrodes 414 on both sides of the PZT 406. In some implementations, the electrode 414 can include nickel. The thickness of the PZT 406 can be 127 μm.

Operations also include spinning and patterning photoresist 424 (420). The photoresist 424 serves as a sacrificial layer. The pattern of the photoresist 424 (which may be based on the design of a photomask) defines the pattern of a multi-foci Fresnel lens. In some implementations, the thickness of photoresist 424 can be 3-4.5 μm. Schematic 422 shows the photoresist 424 formed on top of electrode 414.

Operations also include depositing and patterning lens material 434 (430). In some implementations, the lens material 434 can be parylene. The thickness of parylene can be 3 μm. Schematic 432 shows the lens material 434 formed on top of the electrode 414.

The photoresist 424 is removed through release holes 444 to form air gaps, at operation (440). For example, the release holes 444 may be 30 μm in diameter. Acetone can be used to remove the photoresist 424. Schematic 442 shows the removal of the photoresist 424.

At operation (450), additional lens material 454 is deposited to seal (or "fill") the release holes 444. The additional lens material 454 can be parylene with thickness of 4 μm or 7 μm. Schematic 452 shows the deposited lens material 454 sealing the release holes 444.

Operations further include using epoxy to bond the PZT 406 and silicon 464, which serves as a structural support (460). Schematic 462 shows the final resulting structure of the acoustic tweezer 402, which includes an acoustic transducer 404. It is shown that the PZT 406 and silicon 464 are bonded together.

In some implementations, the silicon 464 can include a silicon chamber formed from two silicon wafers. The silicon chamber can include microfluidic components such as microchannels, liquid chambers, reservoirs, etc. For example, to form such microfluidic components, both sides of the silicon wafers are deposited with 0.8-μm-thick $Si_xN_y$ by a low-pressure chemical vapor deposition (LPCVD) process. The front-side $Si_xN_y$ is patterned, followed by anisotropic etching of silicon in potassium hydroxide (KOH). After etching silicon for the microfluidic components, the $Si_xN_y$ is removed, and the two silicon wafers are bonded together with epoxy. The PZT 406 is adhesively bonded to the silicon wafers where the microfluidic chambers are microfabricated. The microfluidic chambers can have a thickness (e.g., 800 μm) to match the focal lengths of the acoustic tweezer 402.

It is understood that the acoustic tweezer 402 can include one or more characteristics described for the acoustic tweezer 102 and the multi-foci Fresnel lens 204 described in relation to FIGS. 1, 2*a* and 2*b*, respectively.

Figure 5:
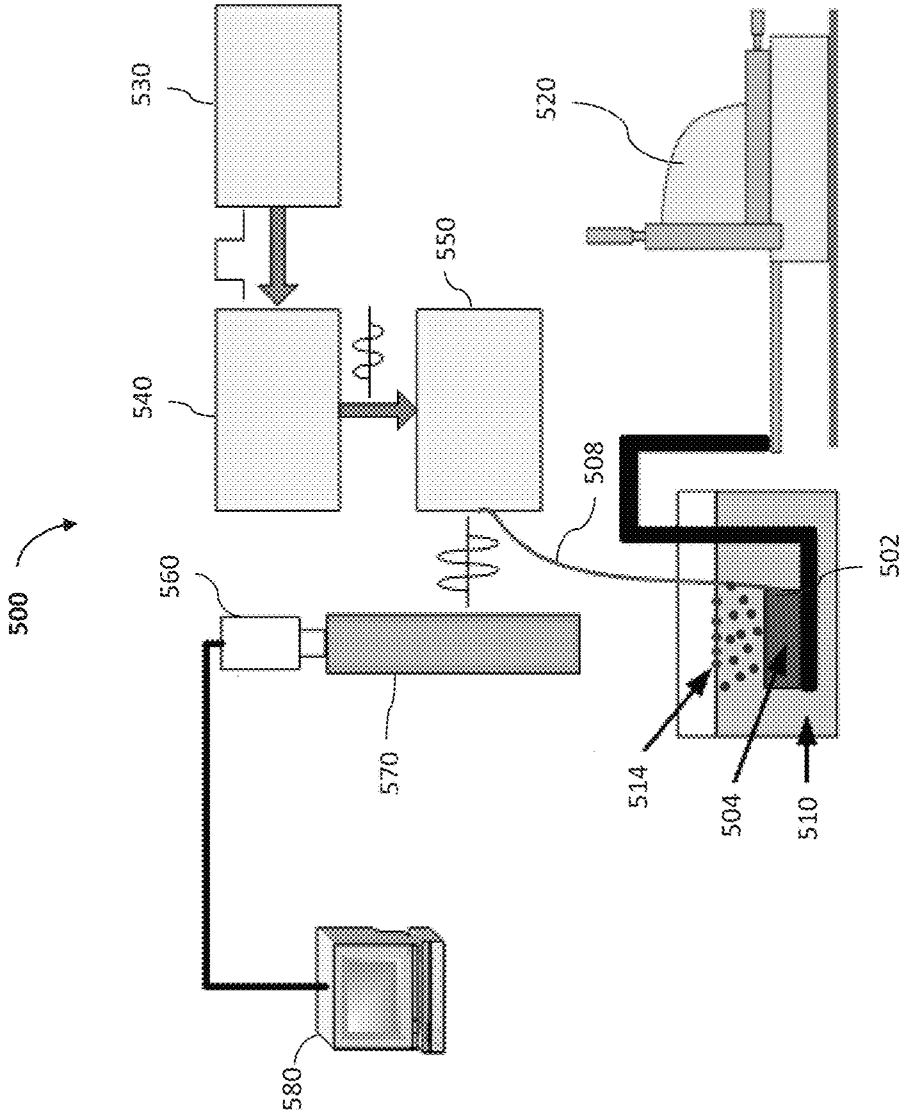
FIG. 5 is an example of a particle trapping system.

FIG. 5 shows an example of a particle trapping system 500 including an acoustic tweezer 502, which includes an acoustic transducer 504 coupled to an XYZ moving stage 520 (e.g., a manual stage). The acoustic tweezer 502 can include a wire 508 which connects a power amplifier 550. In this example, the acoustic tweezer 502 is submerged in deionized (DI) water 510, which includes particles 514 such as lipid particles or microspheres. In some implementations, the particle trapping system 500 can include a pulse generator 530 which provides a signal (e.g., square wave signal) to a signal generator 540. The signal generator 540 can provide a signal (e.g., sinusoidal wave signal) to the power amplifier 550 The power amplifier 550 can provide a signal (e.g., pulsed sinusoidal signal, continuous sinusoidal signal) to actuate the acoustic transducer 504 which generates a Bessel beam (not shown). In some implementations, the particle trapping system 500 can include a charge-coupled device (CCD) camera 560 attached to microscope 570 (which may include a long range-working distance microscope lens). The CCD camera 560 can capture images and/or videos, which can be sent to a computer 580 for recording.

Figure 6:
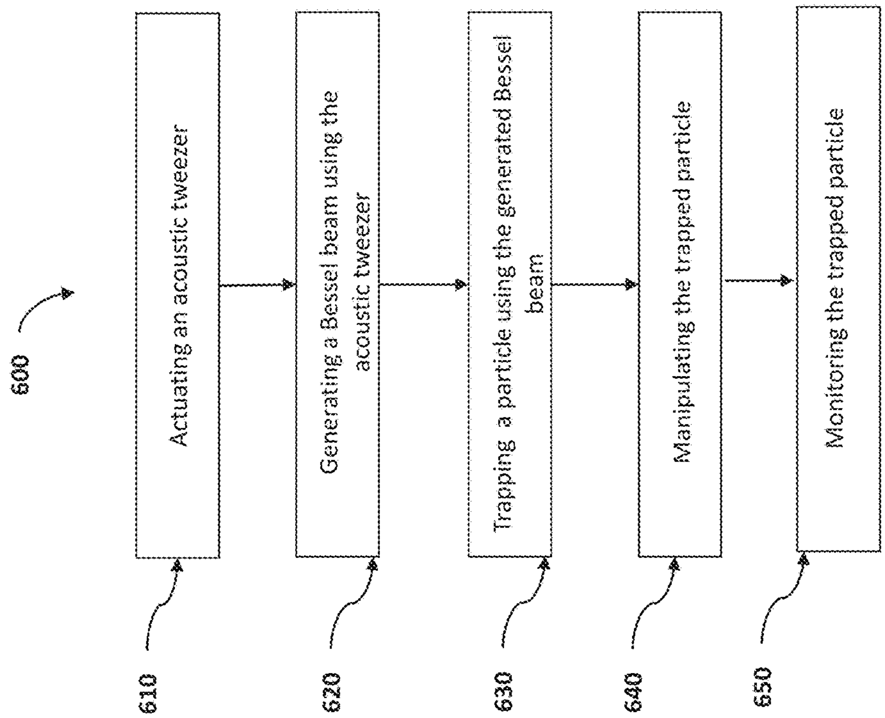
FIG. 6 is a flow chart depicting an example of a sequence of operations for trapping a particle.

Referring to FIG. 6, a flow chart 600 depicts exemplary operations for trapping a particle 614 using an acoustic tweezer 502. Operations include using a power amplifier 550 to actuate the acoustic tweezer 502 (610). In some implementations, a pulsed 17.9 MHz sinusoidal signal is applied to the acoustic tweezer 502 with 10-20 kHz pulse repetition frequency (PRF). Pulsed operation, rather than continuous-wave operation, can be used for low power consumption, low energy trapping without damaging the acoustic tweezer 502 and the particle 514. For example, the pulse width can be 2 s and the sinusoidal signal can have a 160 $V_{peak\text{-}to\text{-}peak}$ amplitude.

Operations also include generating a Bessel beam using the actuated acoustic tweezer 502 (620).

At operation (630), a particle 514 is trapped using the generated Bessel beam.

The trapped particle 514 is manipulated (e.g., moved) in 3-D space using a XYZ stage 520, at operation (640). In some implementations, the distance between the acoustic tweezer 502 and the trapped particle 514 is fixed. The XYZ stage 520 can move the acoustic tweezer 502, which further moves the trapped particle 514.

Operations further include monitoring the trapped particle 514 using a microscope 570 (650). In some implementations, a CCD camera 560 can be attached to the microscope 570 for taking images and/or videos, which can be recorded by a computer 580.

In some implementations, the acoustic tweezer 502 can include a single acoustic transducer 504 which can trap and manipulate more than one particle. Alternatively, in some implementations, the acoustic tweezer 502 can include an array of acoustic Fresnel transducers 504.

In the following, the disclosed techniques are further illustrated using the following examples, which do not limit the scope of the claims.

Example 1—Multi-foci Fresnel Lens

Figure 7A:
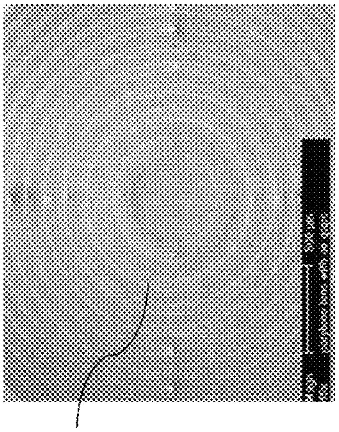
FIGS. 7*a-d* are examples of acoustic tweezers.
Figure 7B:
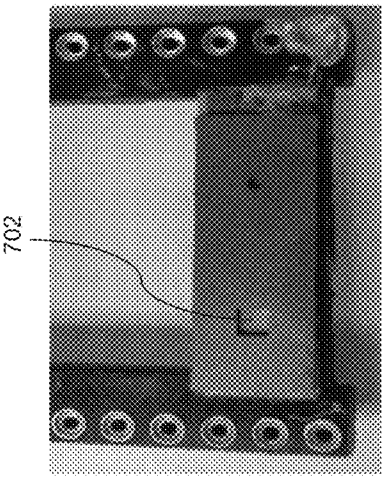

FIG. 7*a* shows a scanning electron microscope (SEM) image of an example acoustic tweezer 702 including a multi-foci Fresnel lens 730. The acoustic tweezer 702 produced a negative pressure region of a few hundred microns in diameter using about 20 MHz ultrasonic waves. The acoustic tweezer 702 successfully trapped polystyrene spheres of 70-210 μm in diameter and a one-cell zebrafish embryo of about 400 μm in diameter, in and on water. Some of the results were presented in Y. Choe et al., Ultrasonic Microparticle Trapping by Multi-Foci Fresnel Lens, Joint Conference of the IEEE International Frequency Control Symposium and European Frequency and Time Forum, 2011 and Y. Choe et al., Microparticle Trapping in An Ultrasonic Bessel Beam, Applied Physics Letter, vol. 99, 233704, 2011, the contents of which are incorporated herein by reference. Trapping by the acoustic tweezer 702 was strong, stable and reliable, and the trapped particles followed the movement of the acoustic tweezers 702. The moving range of the trapped particles was limited only by the movable range of the test apparatus. FIG. 7*b* shows an example of a packaged array of acoustic tweezers 702 each including a multi-foci lens 730.

In some experiments, the acoustic tweezer 702 trapped and manipulated both lipid droplets with diameters ranging 50-200 μm and polystyrene microspheres with diameters ranging 70-90 μm, where the distance between a surface of the acoustic tweezer 702 and the trapped particles were from 2 to 5 mm.

In some experiments, the acoustic tweezer 702 was tested whether it could trap lipid particles ranging from 50-200 μm in diameter and microspheres ranging from 70-90 μm in diameter in water. As the actuated acoustic tweezer 702 produced acoustic waves and stirred the water as well as the particles in and on the water, the particles circled around the tweezers. Once a lipid particle hit the location where a Bessel beam was generated, the lipid particle was firmly trapped to the spot and held there even when another lipid particle hit the trapped particle.

Figure 8B:
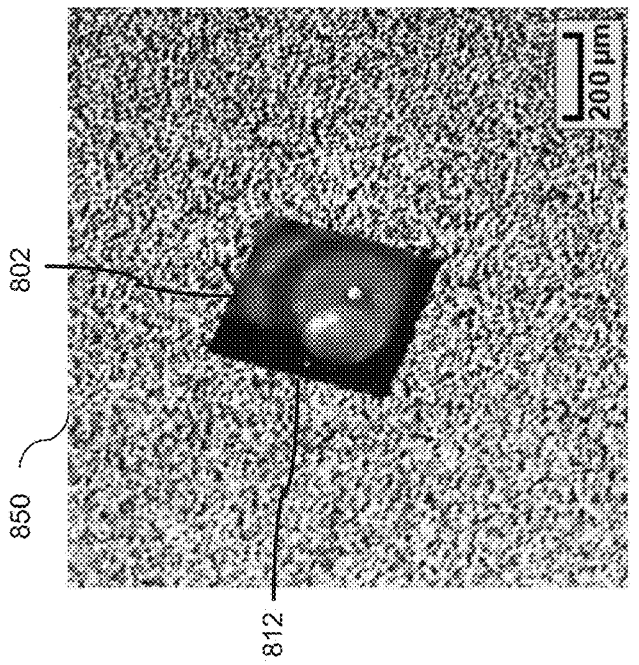
FIGS. 8*a-b* show measurement images of trapping a particle.
Figure 8A:
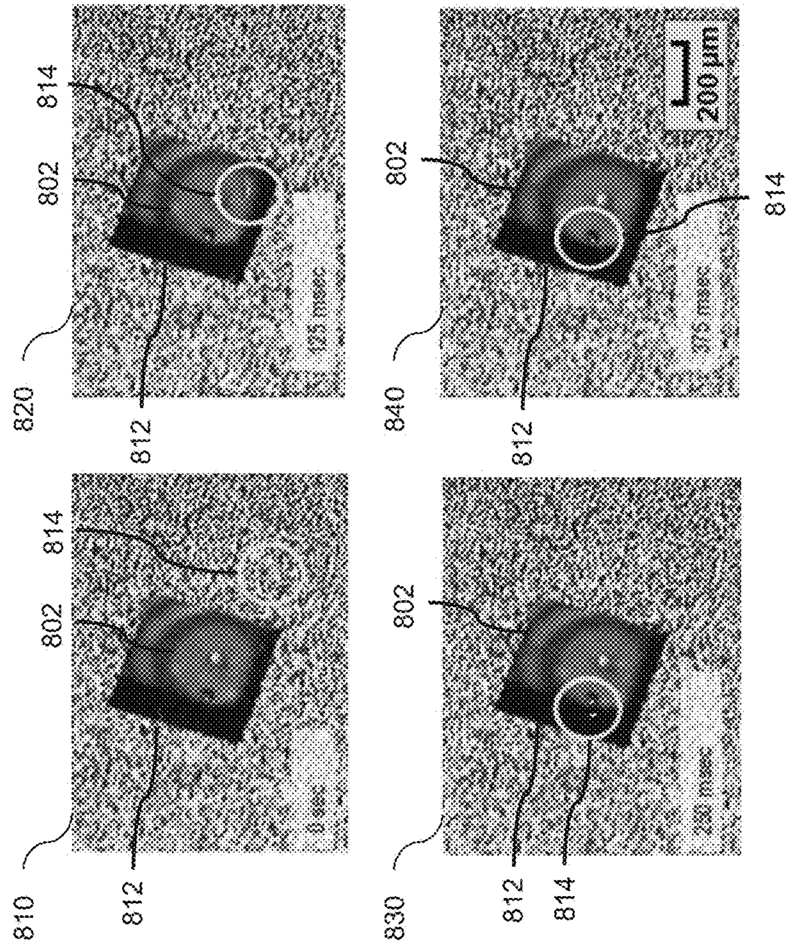

FIG. 8*a* shows a set of measurement images 810, 820, 830 and 840 taken at different times 0, 125, 250 and 375, respectively. Image 810 shows a 72 μm-diameter lipid particle trapped by an acoustic tweezer 802, which were situated below a square opening 812 of a device cover. The circled lipid particle 814 was another drifting lipid particle which hit the already trapped 72 μm-diameter lipid particle, as shown in image 830. The trapped 72 μm-diameter lipid particle was unmoved by the impact from the circled lipid particle 814, as shown in the image 840. The rough frosting dots around the square opening 812 are due to the rough surface of the unpolished silicon-wafer. FIG. 8*b* shows a measurement image 850 where the acoustic tweezer 802 trapped a large 200-μm-diameter lipid particle.

Example 2—Axicon Lens

Figure 7C:
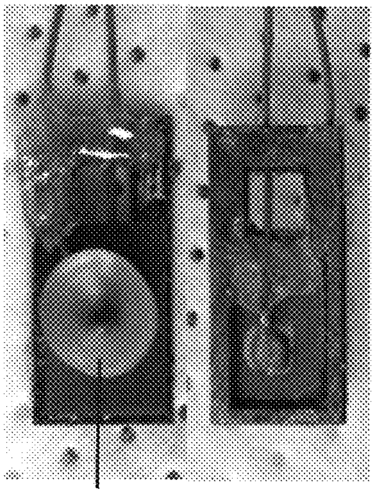
Figure 7D:
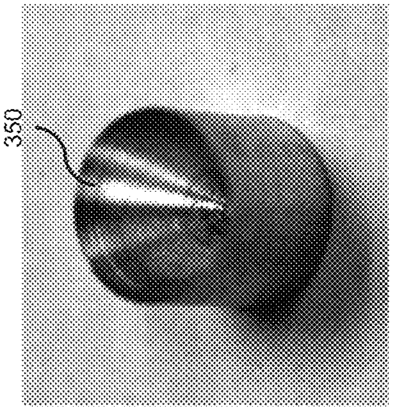

FIGS. 7*c* and 7*d* show an example of a fabricated axicon lens 350 in a top view on top of a micromachined silicon chip with wires and side-view, respectively. The axicon lens 350 was able to capture a particle at the beginning of the experiments. The axicon lens 350 had advantages in that the design and construction were simple.

Figure 9:
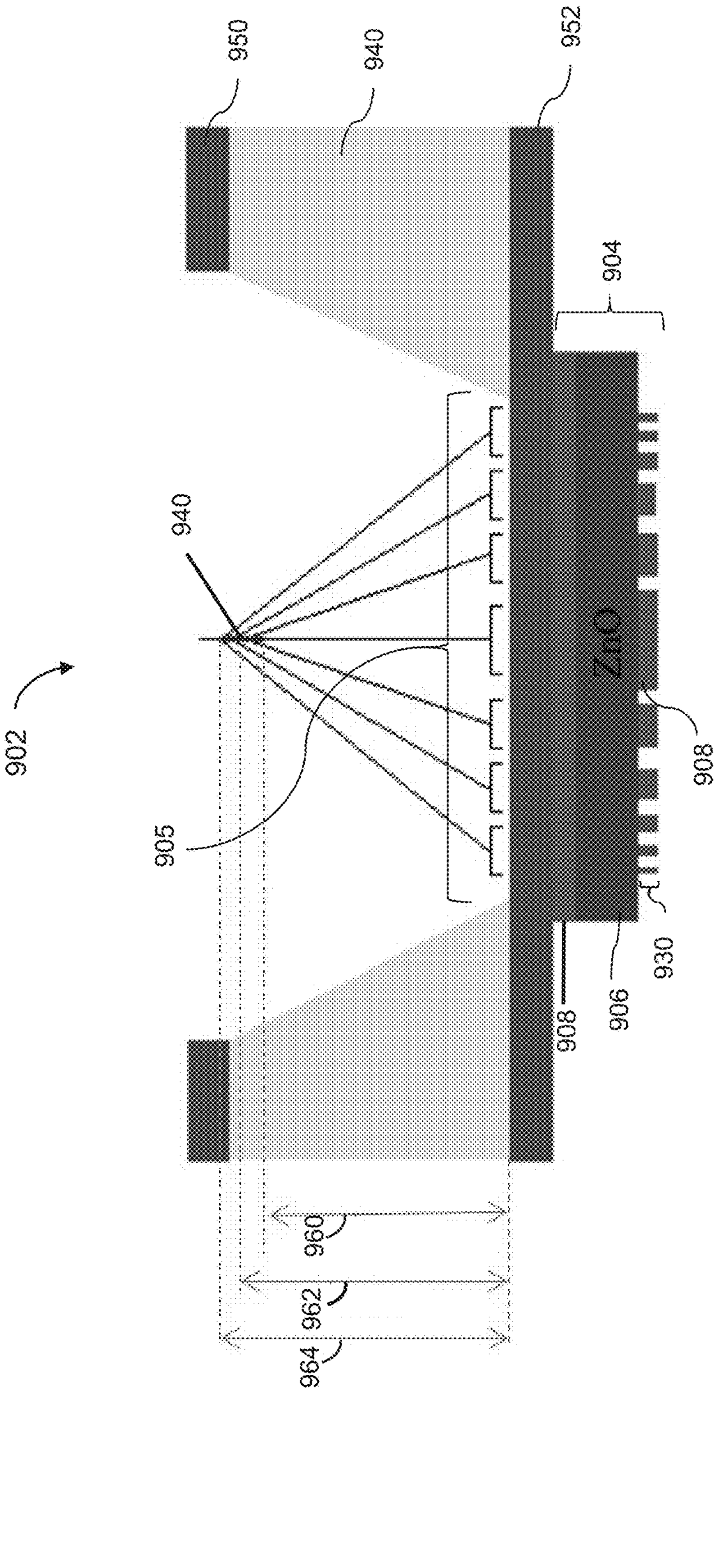
FIG. 9 is a schematic of an example of an acoustic tweezer including an ZnO film.

FIG. 9 shows an example of an acoustic tweezer 902 including an acoustic transducer 904 formed on a substrate 940 (e.g., micromachined silicon substrate). In some implementations, top silicon nitride layer 950 can be used as an etch mask during micromachining of the substrate 940 to form a space which serves as a chamber for liquid including particles. Bottom silicon nitride layer 952 can be used as a support layer for a diaphragm 905 on which the acoustic transducer 904 is built. The acoustic transducer 904 can include a piezoelectric ZnO film 906 and electrode layers 908 for producing acoustic waves in the range of 100-900 MHz. The acoustic tweezer 902 can include the electrode layers 908 which may be patterned to form a multi-foci Fresnel lens 930 for generating an acoustic Bessel beam 940 for producing a negative axial radiation force to trap one or more particles with diameter 10 μm or less. In the example shown in FIG. 9, the acoustic transducer 904 includes the multi-foci Fresnel lens 930, which is a set of annular electrode rings formed by patterning one of the electrodes 908. The Bessel beam 940 can be formed by dividing the annular electrode rings into n groups where each group has a different focal length. The focal length of the n-th group can be chosen to span a distance D according to Eq. (4) shown below:

$$D=\lambda(n-1)/n \quad (4)$$

where λ is the wavelength of the acoustic waves.

In some implementations, the multi-foci Fresnel lens 930 can be formed on a ZnO film 906. For example, the thickness of the ZnO film 906 can be 10 μm. The focal lengths 960, 962, 964 of the inner to the outer rings can be 400 μm, 401.25 μm, 402.5 μm, respectively.

The acoustic tweezer 902 can capture particles with a diameter ranging from 1 to 20 μm in diameter. The distance between the captured particle and the acoustic tweezer 902 can be about 400, 800 and 1,200 μm away, without any mechanical contact between the acoustic transducer 904 and the particles. The acoustic tweezer 902 can be fabricated using microfabrication techniques described in relation to FIG. 10 below.

Figure 10:
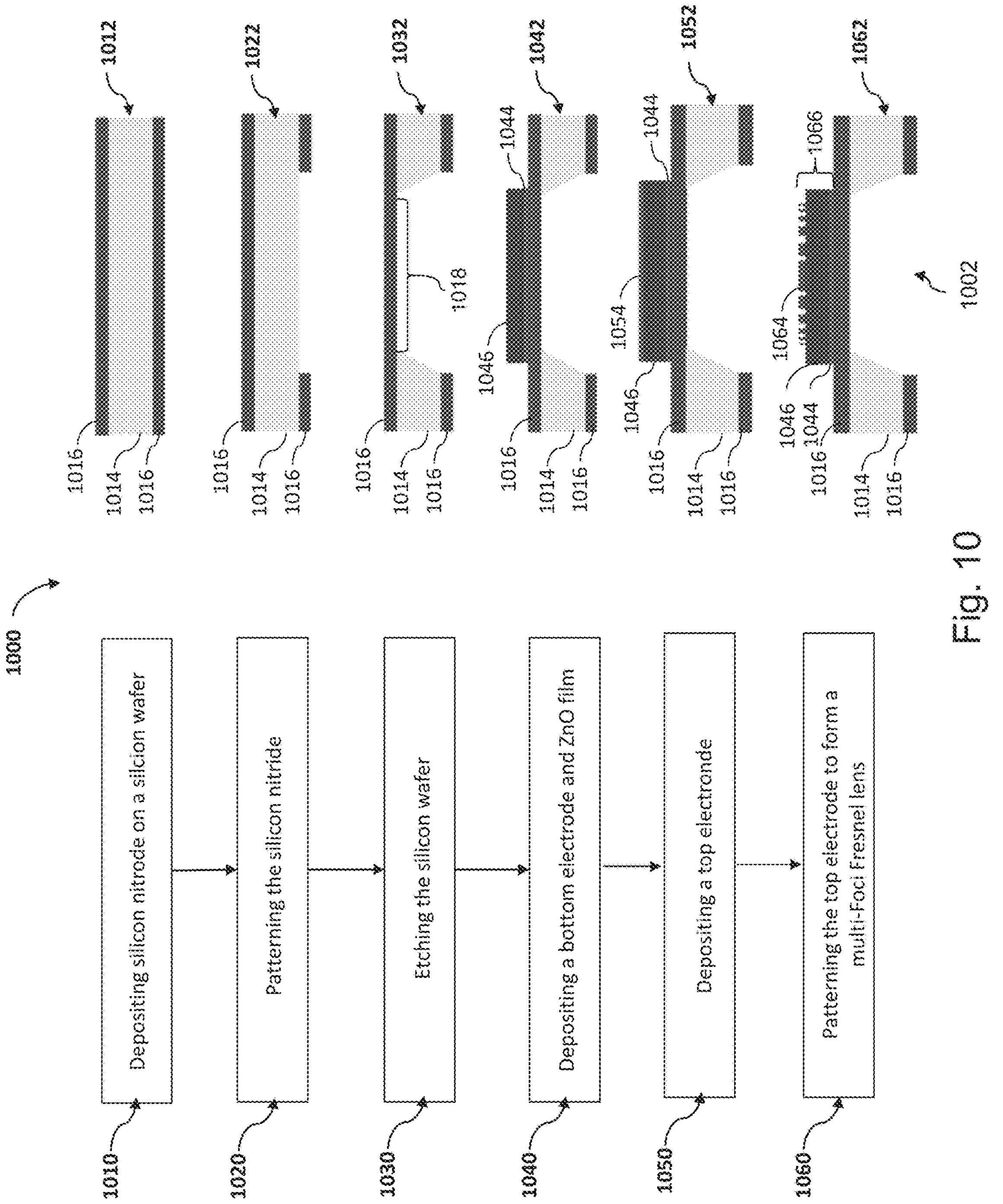
FIG. 10 is a flow chart with schematics depicting an example of a sequence of operations for fabricating an acoustic tweezer including a ZnO film.

Referring to FIG. 10, a flow chart 1000 depicts exemplary operations for fabricating an acoustic tweezer 1002 along with schematic views of corresponding operations. Operations include depositing silicon nitride 1016 on a silicon wafer 1014 (1010). In some implementations, the silicon nitride 1016 can be deposited on both sides of the silicon wafer 1014. The deposition process can be a LPCVD process. Schematic 1012 shows the deposited (low-stress) silicon nitride on both sides of the silicon wafer 1014.

Operations also include patterning the silicon nitride 1016 (1020). Schematic 1022 shows the patterned silicon nitride 1016 on the silicon wafer 1014.

A silicon wafer is etched to form (e.g., creating) a diaphragm 1018, at operation (1030). In some implementations, the etching is achieved using a KOH etching process. Schematic 1032 shows the formed diaphragm 1018 due to the etching process. Further, in some implementations, the silicon wafer can serve as both the substrate and the diaphragm; no diaphragm material 1016 need be deposited, and the silicon wafer can be etched until a 1-100 μm thick portion of silicon remains to form the diaphragm 1018.

A bottom electrode 1044 and a ZnO film 1046 are deposited (1040). A sputtering process can be used for the deposition of the ZnO film 1046 (which may be a piezoelectric film). In some implementations, the bottom electrode 1044 can be an aluminum (Al) layer of 0.2 μm thickness. The thickness of the ZnO film 1046 can be selected depending on the operation frequency of the acoustic tweezer 1002. For example, the thickness of the ZnO film 1046 can be 10 μm for an operation frequency at 300 M Hz. Schematic 1042 shows the deposited bottom electrode 1044 and the ZnO film 1046.

Operations further include depositing a top electrode 1054 (1050). In some implementations, the top electrode 1054 can be an Al layer of 0.2 μm thickness. Schematic 1052 shows the deposited top electrode 1054.

At operation (1060), the top electrode 1054 is patterned to form a multi-foci Fresnel lens 1064. The design of the multi-foci Fresnel lens 1064 can be based on Eq. (3) described earlier. Schematic 1062 shows patterned multi-foci Fresnel lens 1064.

It is understood that operations (1040)-(1060) relate to building of an acoustic transducer 1066. The thickness of the top 1054, bottom 1044 electrodes, ZnO film 1046 is not limited to those described above, but can selected based on the operation characteristics (e.g., operation frequency) of the acoustic tweezer 1002. In some implementations, silicon oxide can be used instead of or in combination with the silicon nitride 1016. Accordingly, the diaphragm 1018 may be formed from diaphragm material including silicon nitride, silicon oxide, silicon, or any combination thereof.

In some implementations, the acoustic tweezer 1002 can be packaged on a copper plate (with SMA connector) which provides electrical connection and an additional reservoir for a liquid. Alternatively, in some implementations, the acoustic tweezer 1002 can be packaged on a brass cylinder. The acoustic tweezer 1002 can be coated with parylene and the whole body of the acoustic tweezer 1002 can be immersed in water. A subminiature hydrophone can be used for characterizing the acoustic beam profile generated by the acoustic tweezer 1002.

The acoustic tweezer 1002 can be operated by applying a pulsed 300 MHz sinusoidal signal using a PRF operation (e.g., at 10-20 kHz). For example, the pulse width can be 1 μsec with a sinusoidal 20 $V_{peak\text{-}to\text{-}peak}$ (e.g., 160 $V_{peak\text{-}to\text{-}peak}$) amplitude. It is understood that the acoustic tweezer 1002 can be used in a similar manner as described in relation to FIG. 5. In some implementations, the multi-foci Fresnel lens 1064 may be considered to include the bottom electrode 1044 and the ZnO film 1046. In some implementations, the bottom electrode 1044 may be patterned similarly or the same as the multi-foci Fresnel lens 1064.

Any of the above described multi-foci Fresnel lenses may be described as a "zone plate." In the following, the disclosed techniques are further illustrated using the following examples, which do not limit the scope of the claims.

Example 3—Acoustic Tweezer Based on ZnO Film

Figure 11B:
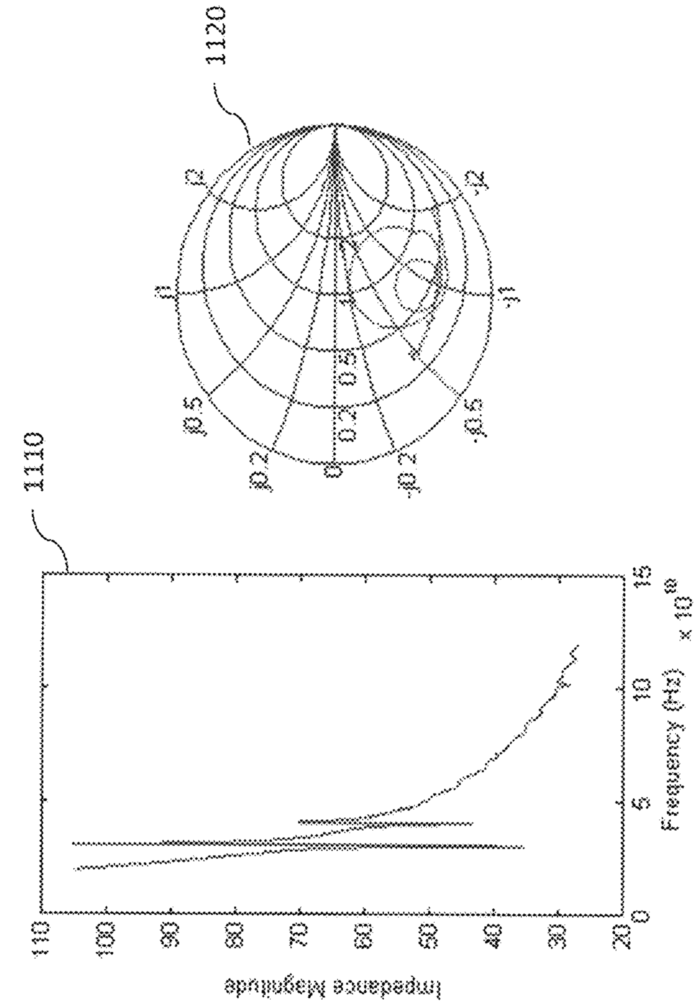
FIG. 11*b* shows characterization results of the acoustic tweezer shown in FIG. 11*a*.
Figure 11A:
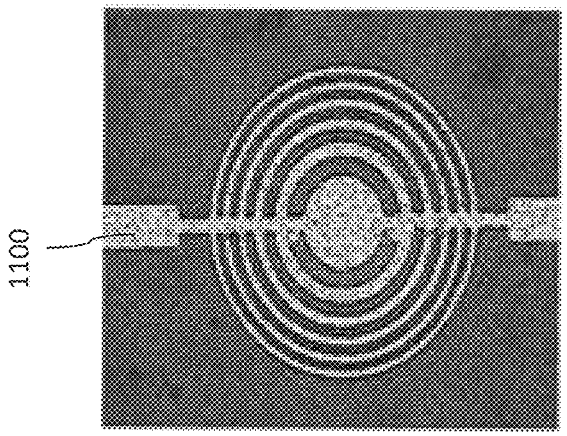
FIG. 11*a* is an example of an acoustic tweezer.

FIG. 11*a* shows a top view of an example acoustic tweezer 1100 with a 10 μm thick ZnO film. The acoustic tweezer 1100 is fabricated using operations described in relation to FIG. 10. FIG. 11*b* shows example characterizations of the acoustic tweezer 1100 using a network analyzer. Plot 1110 shows the impedance magnitude as a function of operating frequency and plot 1120 shows the measured S11 parameter on a Smith chart in air. The plots 1110 and 1120 show that the fundamental thickness-mode resonant frequency (of the 10 μm ZnO film) to be about 300 MHz with a quality factor (Q) of 100 in air.

The acoustic tweezer 1100 could capture microspheres in a liquid reservoir (filled with DI water). The movement of the microspheres was observed with a CCD attached to a microscope, and the images and videos were captured by the CCD are recorded with a computer. As the actuated acoustic tweezer 1100 produced acoustic waves that stirred the water and microspheres, the microspheres circle around the acoustic tweezer 1100. Once a microsphere of 5 μm in diameter hit the location where a Bessel beam is generated, the microsphere was firmly trapped to the spot. The trapped microsphere followed the movement of the acoustic tweezer 1100, when the acoustic tweezer 1100 was moved by the XYZ stage.

Figures 12A, 12B, 12C:
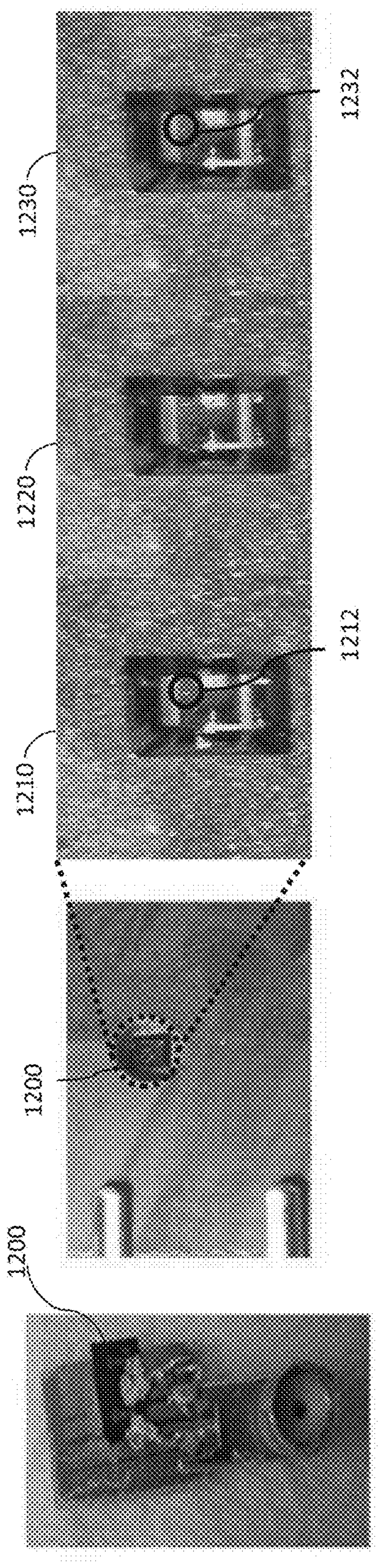
FIGS. 12*a* and 12*b* show an example of an acoustic tweezer.
FIG. 12*c* shows recorded images of the operation of the acoustic tweezer shown in FIGS. 12*a* and 12*b*.

FIG. 12*a* shows a top view of an example acoustic tweezer 1200 packaged on a copper plate. FIG. 12*b* shows a back-side view of the copper plate with a circular hole through which the acoustic tweezer 1200 can be seen. FIG. 12*c* shows measurement results of the operation of the acoustic tweezer 1200. Image 1210 shows a trapped particle 1212 (circled in black solid lines) of 5 μm diameter when the acoustic tweezer 1200 is actuated as described earlier. Image 1220 shows that no particle was trapped when the acoustic tweezer 1200 was not actuated. Image 1230 shows that a particle 1232 (circled in black solid lines) was trapped when the acoustic tweezer 1200 was actuated again.

Figure 13:
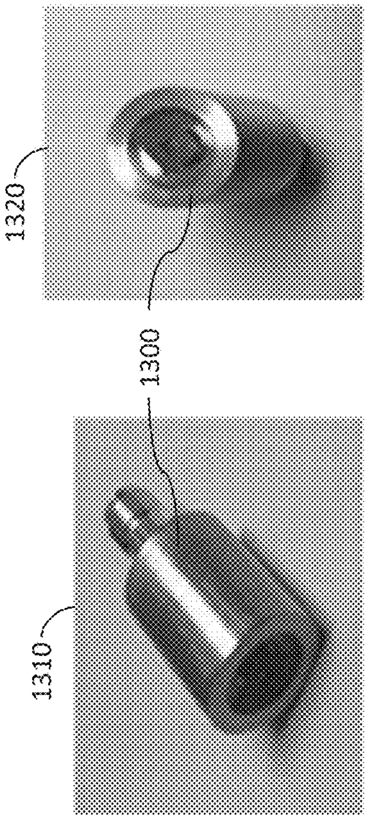
FIG. 13 is an example of an acoustic tweezer.

FIG. 13 shows a side view 1310 and a top view 1320 of an example acoustic tweezer 1300 packaged in brass cylinder. The package formed a water-insulated device which could be immersed in water.

Measurements results showed that the acoustic tweezers could capture a particle in 3-D space. The results showed that if the water height in the reservoir were higher than the focal length of an acoustic tweezer, particles were captured. For example, an acoustic tweezer with 1200 μm focal length captured a 5 μm particle when the acoustic tweezer was operated by a pulsed 300 MHz signal (with PRF of 10 Hz and pulse width of 1 μs) and with a water height larger than 1200 μm. As another example, an acoustic tweezer with 400 μm focal length captured a 5 μm particle when the acoustic tweezer was operated by a pulsed 300 MHz signal (with PRF of 20 Hz and pulse width of 1 μs) and with a water height larger than 400 μm. The acoustic tweezers captured particles without measurable change in the liquid temperature.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. An apparatus comprising:

an XYZ control stage: and acoustic tweezers comprising a single acoustic transducer coupled with the XYZ control stage, the single acoustic transducer configured to generate, when actuated by a sinusoidal signal, an acoustic wave having a frequency of the sinusoidal signal and propagating along a center line, the single acoustic transducer comprising a multi-foci Fresnel lens, wherein the multi-foci Fresnel lens comprises annular rings centered on the center line, at least two annular rings having different focal lengths, the first of the at least two annular rings disposed closer to the center line than the second of the at least two annular rings, the first of the at least two annular rings being configured to focus a corresponding first portion of the acoustic wave to a first focal spot on the center line, and the second of the at least two annular rings disposed farther from the center line than the first of the at least two annular rings, the second of the at least two annular rings being configured to focus a corresponding second portion of the acoustic wave to a second focal spot on the center line, the first focal spot being positioned closer with respect to the multi-foci Fresnel lens than the second focal spot to form, along the center line and between the first and second focal spots, a negative pressure region capable of trapping one or more particles without the aid of other devices, including another acoustic tweezer or a MYLAR® sheet.

2. The apparatus of claim 1, wherein the multi-foci Fresnel lens consists of seven annular rings, starting radially inward, the first two of the seven annular rings having a first focal length corresponding to the first focal spot, the next two of the seven annular rings being disposed farther from the center line than the first two of the seven annular rings and having a second focal length longer than the first focal length and corresponding to the second focal spot, and the remaining three of the seven annular rings being disposed farther from the center line than the next two if the seven annular rings and having a third focal length longer than the second focal length and corresponding to a third focal spot positioned farther with respect to the multi-foci Fresnel lens than the second focal spot.

3. The apparatus of claim 1, wherein the annular rings consist of any number of annular rings between two and twelve, and the annular rings are grouped into any number of sets between two and twelve, wherein each set has a different focal length, with increasing focal length of each set corresponding to increasing annular ring radii of each set, wherein the first of the at least two annular rings is in one set with one focal length and the second of the at least two annular rings is in another set with another focal length that is greater than the one focal length.

4. The apparatus of claim 3, wherein a radius $r_k$, of an annular ring of order k of a $j^{th}$ set of annular rings of the multi-foci Fresnel lens is related to the focal length $F_j$ of the $j^{th}$ set and the wavelength λ of the acoustic wave generated by the single acoustic transducer as $$r_k = \sqrt{2k\lambda\left(F_j + \frac{k\lambda}{2}\right)},$$

where j=1, . . . , N with N≥2 is an index of focal points $P_1, \ldots, P_N$ of the multi-foci Fresnel lens to which the focal lengths $F_1, \ldots F_N$ correspond.

5. The apparatus of claim 1, wherein the multi-foci Fresnel lens comprises one or more air-reflectors.

6. The apparatus of claim 1, wherein the multi-foci Fresnel lens is formed on a PZT (lead zirconate titanate) ultrasonic transducer with top and bottom electrodes sandwiching the PZT.

7. The apparatus of claim 1, wherein the multi-foci Fresnel lens comprises circular electrodes on top and bottom surfaces of a PZT.

8. The apparatus of claim 1, wherein the multi-foci Fresnel lens comprises one or more pie-shaped electrodes on top and bottom surfaces of a PZT.

9. The apparatus of claim 1, wherein the multi-foci Fresnel lens is formed on a silicon substrate with ZnO film, AlN film, or PZT film.

10. The apparatus of claim 1, wherein the multi-foci Fresnel lens is integrated with microfluidic components built on a silicon, glass or plastic substrate.

11. The apparatus of claim 1, wherein the sinusoidal signal to actuate the single acoustic transducer is a continuous sinusoidal signal.

12. The apparatus of claim 1, wherein the sinusoidal signal to actuate the single acoustic transducer is a pulsed sinusoidal signal.

13. The apparatus of claim 12, wherein the pulsed sinusoidal signal has the frequency in a range of 1-100 MHz with a pulse width in a range of 1-1 μs, and the pulse[d] sinusoidal signal is applied to the single acoustic transducer with a pulse repetition frequency in a range of 10-20 kHz.

14. The apparatus of claim 12, wherein the pulsed sinusoidal signal has the frequency in a range of 100-900 MHz with a pulse width in a range of 0.1-1 μs, and the pulse[d] sinusoidal signal is applied to the single acoustic transducer with a pulse repetition frequency in a range of 10-20 kHz.

15. The apparatus of claim 12, wherein the pulsed sinusoidal signal has the frequency in a range of 100-900 MHz with a pulse width in a range of 0.1-1 μs, and the pulse[d] sinusoidal signal is applied to the single acoustic transducer with a pulse repetition frequency in a range of 10-100 Hz.

16. A method of microparticle trapping in three dimensional space, the method comprising:

providing the apparatus of claim 14, using the single acoustic transducer to produce said negative pressure region, wherein said negative pressure region is on a micron scale range and trapping the one or more particles, wherein said particles are microparticles.

* * * * *

UNITED STATES PATENT AND TRADEMARK OFFICE

CERTIFICATE OF CORRECTION

PATENT NO. : 10,106,397 B1
APPLICATION NO. : 13/868965
DATED : October 23, 2018
INVENTOR(S) : Eun Sok Kim et al.

It is certified that error appears in the above-identified patent and that said Letters Patent is hereby corrected as shown below:

In the Claims

Column 11, Line 29, in Claim 1, delete "stage:" and insert -- stage; -- therefor.

Column 11, Line 66, in Claim 2, delete "if" and insert -- of -- therefor.

Column 12, Line 15, in Claim 4, delete "$r_k$," and insert -- $r_k$ -- therefor.

Column 12, Line 17, in Claim 4, delete "to the" and insert -- to a -- therefor.

Column 12, Line 55, in Claim 13, delete "1-1" and insert -- 1-10 -- therefor.

Column 12, Line 55, in Claim 13, delete "pulse[d]" and insert -- pulsed -- therefor.

Column 12, Line 60, in Claim 14, delete "0.1-1" and insert -- 0.1-10 -- therefor.

Column 12, Line 60, in Claim 14, delete "pulse[d]" and insert -- pulsed -- therefor.

Column 12, Line 65, in Claim 15, delete "0.1-1" and insert -- 0.1-10 -- therefor.

Column 12, Line 65, in Claim 15, delete "pulse[d]" and insert -- pulsed -- therefor.

Signed and Sealed this
Eighth Day of January, 2019

Andrei Iancu
*Director of the United States Patent and Trademark Office*